United States Patent [19]

Drummond

[11] 4,096,455
[45] Jun. 20, 1978

[54] SURFACE WAVE TERMINATION FOR SAW DEVICE

[75] Inventor: William Seth Drummond, Cornelius, Oreg.

[73] Assignee: Tektronix, Inc., Beaverton, Oreg.

[21] Appl. No.: 771,234

[22] Filed: Feb. 23, 1977

[51] Int. Cl.² .................... H03H 9/06; H03H 9/26; H03H 9/30; H03H 9/32
[52] U.S. Cl. ................... 333/30 R; 310/313; 333/72
[58] Field of Search ............ 333/30 R, 72; 310/313

[56] References Cited

U.S. PATENT DOCUMENTS 4,047,130  9/1977  Lim et al. ........................ 333/72

*Primary Examiner*—Alfred E. Smith
*Assistant Examiner*—Marvin Nussbaum
*Attorney, Agent, or Firm*—John D. Winkelman

[57] ABSTRACT

A two stage surface wave termination for a surface acoustic wave device, such as a filter or delay line. The termination includes a wafer of an acoustically lossy, relatively hard polymeric material that is bonded to the surface of the SAW device's piezoelectric substrate between an end of the substrate and an interdigitated transducer provided thereon. A band of an elastomeric material is bonded to the substrate along the edge of the wafer nearest the transducer.

10 Claims, 3 Drawing Figures

SURFACE WAVE TERMINATION FOR SAW DEVICE

BACKGROUND AND OBJECTS OF THE INVENTION

The present invention relates generally to surface acoustic wave devices, and in particular to a surface wave termination for such devices.

Surface acoustic wave (SAW) devices have been employed for a wide variety of signal processing functions, and the basic technology is well known in the art.

In elementary form, a surface wave transducer comprises a pair of parallel, spaced metal electrodes disposed on a piezoelectric substrate. When an alternating electrical potential is applied to the electrodes, an alternating electric field is generated that causes localized vibrations in the substrate material. These vibrations give rise to acoustic waves, which propagate along the surface of the substrate in a well defined path orthogonal to the electrodes, and may be detected at any point along the path by a second, receiving transducer. Typically, both the transmitting, or launching, transducer and the receiving transducer are formed from interdigitated comb-like multi-electrode elements, the electrical characteristics of the transducer being determined by the number, spacing, and dimensional configuration of the electrodes in each element. The electrodes typically are formed from deposited metal films and have a thickness less than 10% of the acoustic wavelength to minimize mass loading.

Transducers of the type just described are bidirectionally responsive, i.e., they launch surface waves in opposite directions simultaneously and receive waves traveling in either direction. This is a significant problem in most SAW devices because in addition to responding to surface waves traveling directly from one transducer to the other, the transducers respond to surface waves reflected from the ends of the substrate. These reflected surface waves produce unwanted signals that distort the main, desired signal, adversely affecting the performance of the SAW device. A widely practiced method of suppressing the reflected waves is to apply an absorbent material, typically "black wax", to the edges of the substrate behind each transducer. Black wax is applied in the form of a solvent solution. After evaporation of the solvent, a hard, brittle wax deposit remains. While black wax minimizes reflections from the substrate edges fairly effectively, surface waves are reflected from the front edges of the hard wax deposits. These reflections are of reduced amplitude, but still degrade SAW device performance.

A phasing method for eliminating the effect of substrate and reflections is disclosed in U.S. Pat. No. 3,955,159. No absorbent material is used; instead, the transducer is constructed in such a way that end-reflected waves are cancelled out at the receiving transducer. For complete cancellation, however, the transmitting and receiving transducers must be perfectly aligned relative to each other and to the adjacent ends of the substrate, which must be perfectly smooth and orthogonal to the wave path. In addition, the phasing method is limited in application to relatively narrow frequency range devices.

Accordingly, a general object of the present invention is to provide means for substantially eliminating output distortion or spurious responses in SAW devices caused by reflections of surface acoustic waves from the ends of the device's substrate. A more specific object is to provide a surface wave termination system that inhibits such reflections.

Another object of the invention is to provide means for inhibiting surface wave reflections from the end of a SAW device substrate without the disadvantages associated with prior art methods.

Still another object of the invention is to provide a SAW device surface wave termination system that employs readily available materials and standard application techniques.

Briefly stated, the invention contemplates a two-stage surface wave termination system that is applied to a SAW device substrate intermediate as interdigitated transducer provided thereon and the end of the substrate nearest the transducer. One stage comprises a wafer of an acoustically lossy polymeric material mechanically coupled, as by bonding, to the substrate surface. The edge of the wafer nearest the transducer preferably is skewed relative to the main path of surface acoustic wave propagation on the substrate. The second stage of the system comprises a band of elastomeric material secured to the substrate surface along the edge of the wafer nearest the transducer. In operation, surface acoustic waves propagated toward the end of the substrate are effectively absorbed or otherwise reduced to an undetectable level by the termination system.

Additional objects, features and advantages of the present invention will become apparent as the following detailed description is read in conjunction with the accompanying drawings.

DETAILED DESCRIPTION OF THE INVENTION

Figure 1:
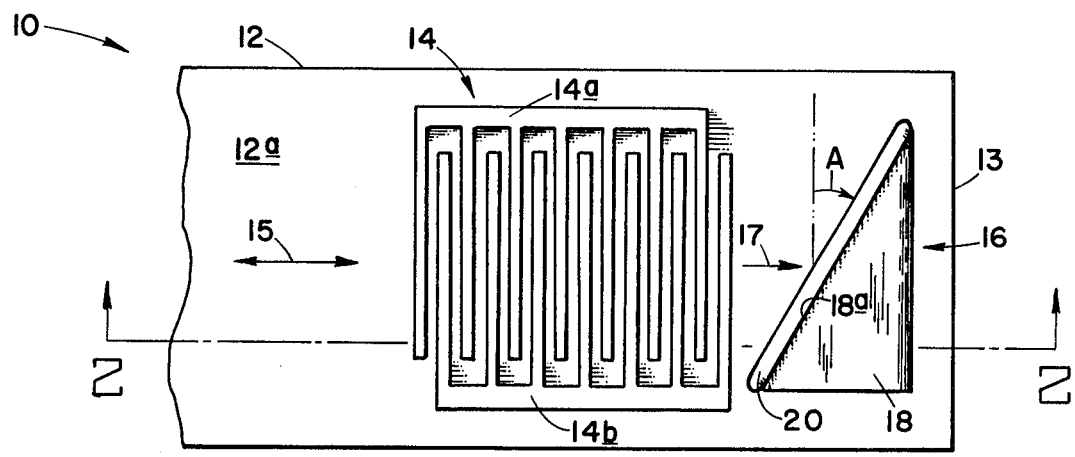
FIG. 1 is a fragmentary plan view of a SAW device incorporating the surface wave termination of the present invention.
Figure 2:
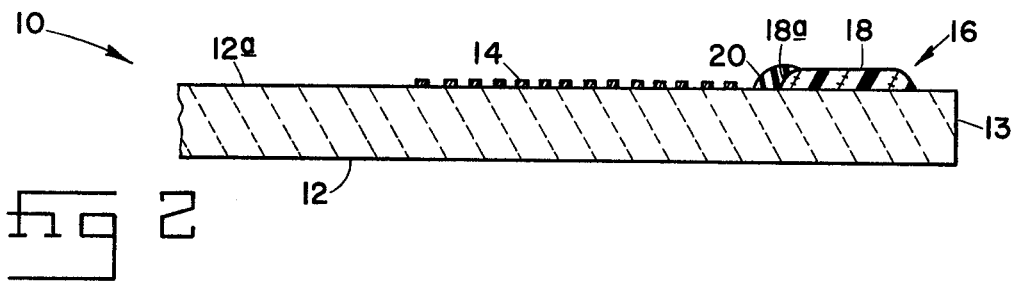
FIG. 2 is a longitudinal cross section taken along line 2—2 in FIG. 1.

Turning now to the drawings, and first to FIGS. 1 and 2 thereof, one end of a surface acoustic wave device is indicated generally at 10. As will be understood, device 10, shown herein in fragmentary, simplified form, may be any conventional SAW device, such as communication system filter or delay line. SAW device 10 includes an elongate rectangular substrate 12 of a piezoelectric material, suitably crystalline quartz, lithium niobate, lithium tantalate, or the like, having a transducer 14 applied to its upper surface 12a in a known manner. In the embodiment shown, transducer 14 is a single section interdigitated electrode array of the uniform overlap type, and includes opposed comb elements 14a, 14b. As will be understood, comb elements 14a, 14b are connected in a suitable manner to external electrical circuitry (not shown).

Bonded to substrate surface 12a intermediate transducer 14 and the adjacent end 13 of the substrate is a two stage surface wave termination, or end load, 16. In the preferred practice of the invention, the front side, or edge, of termination 16 (i.e., the edge nearest transducer 14) is skewed relative to the fingers of transducer combs 14a, 14b, and thus relative to the principal acoustic response axis 15 of the transducer. The skew angle A, while not critical, preferably is at least abouut 20°. In the embodiment shown, a 30° skew angle is used.

Termination 16 includes a wafer 18 of an acoustically lossy, relatively hard polymeric material, and a contiguous strip, or band, 20 of an elastomeric material disposed along the skewed front edge of the termination. The polymeric material comprising wafer 18 should be at least a moderately good acoustic match with the material of substrate 12 for good transfer of acoustic wave energy to the load, in addition to being acoustically lossy over the frequency range of device 10. Wafers comprised of cured epoxy resins are well suited for use in devices having lithium niobate substrates and operating in the HF range (about 10 to about 50 MHz). Commerically available epoxy film adhesives of the type commonly used for sealing microelectronic packages have been used with excellent results, an example being a glass cloth-supported modified epoxy film adhesive supplied by Ablestik Laboratories, Gardena, Calif., under the designation Ablefilm 550. Supplied in partially cured form, the film, which has a nominal thickness of about 0.005 in., is cut to the desired configuration (herein triangular) and applied directly to the upper surface of substrate 12, after which it is cured for about 2 hours at about 150° C. During the elevated temperature cure, the epoxy adhesive softens and flows out slightly to provide the cured wafer with smoothly tapered edges, as shown in FIG. 2. At the same time, wafer 18 becomes intimately bonded to surface 12a. It is important that glass reinforced epoxy films contain sufficient resin to insure that the rough edges of the reinforcing material are not exposed when the epoxy flows out during curing.

Elastomer band 20, suitably of a room temperature cured silicone rubber such as Dow Corning Type 3140 or 3141, is bonded to substrate surface 12a along the front edge 18a of wafer 18. For efficient use of substrate space, as well as application convenience, band 20 suitably is applied adjoining wafer 18, overlapping edge 18a as shown in FIG. 2. It is not required that band 20 be in contact with wafer 18, however.

As will be understood, transducer 14 is bidirectionally responsive to surface acoustic waves propagated along a path on substrate surface 12a that is orthogonal to the fingers of combs 14a, 14b, and has a width equal to the overlap of the fingers. In operation, surface waves propagated toward substrate end 13 from transducer 14 (i.e., in the direction of arrow 17) will be intercepted by termination 16, which spans the propagation path intermediate the transducer and substrate end.

The elastomeric material forming band 20 is poorly coupled to surface 12a because of its resiliency, and hence is not a good acoustic load for surface waves in the HF range, particularly the lower portion of the range. For that reason, there is no measurable reflection from the front edge of band 20. Wafer 18 is of a relatively hard material that is well coupled to surface 12a, however, and a certain amount of incident surface wave energy is reflected from its edge 18a. Such reflections, which are significantly reduced by the tapered profile of wafer edge 18a, are essentially completely absorbed by elastomer band 20. It will be evident that band 20 should be of sufficient width to absorb reflections from the front edge of wafer 18, the minimum necessary width being dependent on the acoustic absorption characteristics of the elastomer used. It is not necessary to the invention that the front edge of termination 16 be skewed, but doing so makes the width of band 20 less critical. Any residual reflected energy not absorbed by the band is directed away from the propagation path and is not picked up by transducer 14. In practice, it has been found that the two stage surface wave termination described herein has an attenuation factor of 60 dB or more in the HF range.

Figure 3:
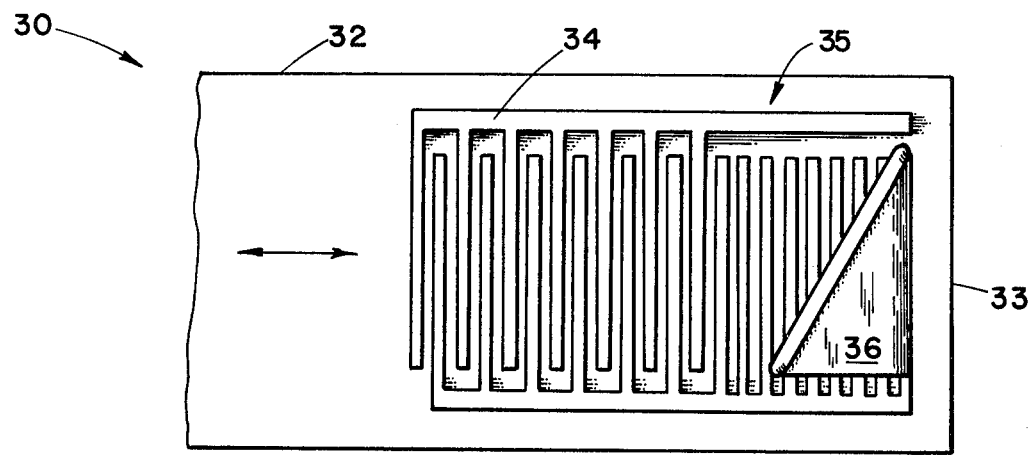
FIG. 3 is a fragmentary plan view of a different type of SAW device incorporating the surface wave termination of the invention.

An alternative application of the two stage surface wave termination of the invention is shown in FIG. 3. A SAW device 30 therein includes a piezoelectric substrate 32 on which a transducer 34 is deposited. Transducer 34 is similar to transducer 14, except that it includes a dummy, or inactive, section 35 containing no overlapping electrodes. As those in the art will understand, dummy section 35 is provided to eliminate so-called "end effects" caused by the differences in substrate surface metallization, and hence in surface wave velocity, between the transducer pattern and the free, or non-pattern bearing, substrate behind the transducer. The comb fingers in section 35 have the same periodicity as those in the active section of the transducer. A two stage termination 36 substantially identical to previously described termination 16 is bonded to the substrate atop dummy section 35. Termination 36 intercepts surface waves traveling toward end 33 of the substrate from the active, or interdigitated, portion of transducer 34, and prevents them from reflecting from the end of the substrate.

The novel surface wave termination of the invention also may be used to isolate different SAW devices or sections of such devices that are contained on a common substrate, and in such use the termination would not necessarily be disposed adjacent an edge or end of the substrate.

While the best mode presently contemplated for practicing the invention has been described in detail, it will be apparent to those of ordinary skill in the art that various changes and modifications may be made without departing from the scope of the invention as claimed. For example, the end load of the invention may be used in conjunction with other types of transducers, such as apodized transducers, and other polymeric and elastomer materials may be used in the construction of the surface wave termination.

I claim:

1. In a surface acoustic wave device comprising a substrate of material capable of propagating acoustic waves along a surface of the substrate, and transducer means including an interdigitated electrode disposed on said surface and responsive to acoustic waves propagated along a path on said surface, surface wave termination means associated with said electrode for absorbing surface waves propagated along said path toward said means, comprising a wafer of an acoustically lossy polymeric material spanning said path and coupled to said substrate surface, and a band of elastomeric material secured to said surface along an edge of said wafer that generally faces said electrode.

2. The device of claim 1, wherein the edge of said wafer nearest said electrode includes a portion that is skewed relative to said path.

3. The device of claim 1, wherein said wafer is comprised of a cured epoxy resin bonded to said substrate surface, and said elastomeric material comprises a silicone rubber.

4. The device of claim 1, wherein said termination means is disposed intermediate said electrode and an adjacent edge of said substrate to inhibit surface wave reflections from said edge.

5. In a surface acoustic wave device comprising a substrate of piezoelectric material capable of propagating acoustic waves along a surface of the substrate, and at least a pair of interdigitated electrodes disposed on said surface adjacent the opposite ends of a path thereon, said electrodes being responsive to acoustic waves propagated along said path, surface wave termination means associated with at least one of said electrodes for minimizing surface wave reflections from the end of the substrate nearest the associated electrode, said means comprising a wafer of an acoustically lossy polymeric material bonded to said substrate surface intermediate said end and associated electrode, and a band of solid elastomeric material bonded to said substrate surface along and adjoining an edge of said wafer facing the opposite end of said substrate.

6. The device of claim 5, wherein the edge of said wafer facing said opposite end of the substrate is skewed relative to said path.

7. The device of claim 5, wherein said wafer consists essentially of a cured, glass reinforced epoxy resin, and said elastomeric material consists essentially of a silicone rubber.

8. The device of claim 5, wherein said end loading means further comprises a dummy electrode intermediate said interdigitated electrode and nearest end, and said wafer is disposed atop said dummy electrode.

9. A surface acoustic wave device comprising a piezoelectric substrate for propagating acoustic waves along a surface thereof, a pair of interdigitated electrodes disposed on said surface at the opposite ends of a path thereon, said electrodes being responsive to acoustic waves propagated along said path, and surface wave termination means associated with at least one of said electrodes for minimizing the reflection of surface waves from the end of said substrate nearest the associated electrode, said termination means comprising a wafer of an acoustically lossy, relatively hard polymeric material bonded to said substrate surface intermediate said end and associated electrode, said wafer having an edge portion generally facing the opposite end of the substrate and skewed relative to said path, and a band of elastomeric material bonded to said surface along and adjoining said edge.

10. The device of claim 9, wherein said polymeric material consists essentially of a cured glass-reinforced epoxy resin, and said elastomeric material consists essentially of a silicone rubber.

* * * * *